(12) United States Patent
Park et al.

(10) Patent No.: US 11,029,374 B2
(45) Date of Patent: Jun. 8, 2021

(54) APPARATUS FOR OPERATING OPTICAL-REFLECTOR AND APPARATUS AND METHOD FOR CONTROLLING POSITION OF OPTICAL-REFLECTOR

(71) Applicant: JAHWA electronics Co., Ltd., Chungcheongbuk-Do (KR)

(72) Inventors: Chui Soon Park, Chungcheongnam-do (KR); Jung Min Son, Incheon (KR); Sang hwa Lee, Daegu (KR)

(73) Assignee: JAHWA ELECTRONICS CO., LTD., Chungcheongbuk-Do (KR)

( * ) Notice: Subject to any disclaimer, the term of this patent is extended or adjusted under 35 U.S.C. 154(b) by 107 days.

(21) Appl. No.: 16/357,847

(22) Filed: Mar. 19, 2019

(65) Prior Publication Data
US 2020/0158793 A1 May 21, 2020

(30) Foreign Application Priority Data
Nov. 15, 2018 (KR) .......................... 10-2018-0140420

(51) Int. Cl.
*G01R 33/07* (2006.01)
*G01D 5/14* (2006.01)
(52) U.S. Cl.
CPC ........... *G01R 33/072* (2013.01); *G01D 5/145* (2013.01)

(58) Field of Classification Search
None
See application file for complete search history.

(56) References Cited

U.S. PATENT DOCUMENTS

| 5,691,965 | A | * | 11/1997 | Jansen | ............... | G06K 7/10643 |
| | | | | | | 369/44.11 |
| 2010/0239237 | A1 | * | 9/2010 | Lee | ........................ | G03B 17/00 |
| | | | | | | 396/55 |
| 2012/0229926 | A1 | * | 9/2012 | Wade | ........................ | G02B 7/04 |
| | | | | | | 359/824 |
| 2012/0236414 | A1 | * | 9/2012 | Hwang | ............... | G02B 27/646 |
| | | | | | | 359/554 |
| 2016/0299350 | A1 | * | 10/2016 | Hu | ........................ | G02B 27/646 |

* cited by examiner

*Primary Examiner* — Nasima Monsur
(74) *Attorney, Agent, or Firm* — The PL Law Group, PLLC

(57) ABSTRACT

An apparatus for operating an optical-reflector includes a first carrier configured to rotate based on a first direction perpendicular to an optical axis, a second carrier having an optical-reflector for reflecting a light toward a lens and accommodated in the first carrier to rotate based on a second direction perpendicular to both the optical axis and the first direction with respect to the first carrier, a plurality of magnets provided to the second carrier at different positions, a plurality of hall sensors configured to output signals respectively corresponding to the positions of the plurality of magnets, and a position control unit configured to calculate the signals input from the plurality of hall sensors to generate a position signal that is a signal about a current position of the second carrier.

11 Claims, 8 Drawing Sheets

APPARATUS FOR OPERATING OPTICAL-REFLECTOR AND APPARATUS AND METHOD FOR CONTROLLING POSITION OF OPTICAL-REFLECTOR

CROSS-REFERENCE TO RELATED APPLICATION AND CLAIM OF PRIORITY

This application claims priority to Korean Patent Applications No. 10-2018-0140420 filed on Nov. 15, 2018 in the Korean Intellectual Property Office (KIPO), the entire disclosure of which is incorporated by reference herein.

TECHNICAL FIELD

The present disclosure relates to an apparatus for operating an optical-reflector and an apparatus and method for controlling a position of an optical-reflector, and more particularly, to an apparatus and method for operating or controlling a position of an optical-reflector more precisely by using a plurality of hall sensors installed at positions having different moving displacements.

BACKGROUND ART

Along with the development of hardware techniques and the change of user environments or the like, various and complicated functions are integrally implemented at a portable terminal (or, a mobile terminal) such as a smart phone, in addition to a basic function for communication.

One of the representative examples is optical image stabilization (OIS), which corrects a hand shaking of a user or the like to capture a clear image of a subject.

The OIS is a method to correctively move a lens or a carrier having the lens when a phenomenon such as a hand shaking occurs, to generate a clear image. In order to accurately grasp a position of the carrier (representing a position of the lens), a sensor such as a hall sensor is applied.

The hall sensor is a sensor that senses a magnetic force of a magnet attached to the carrier or the like by using a hall effect and outputs an electric signal corresponding to the magnetic force. The hall sensor outputs electrical signals of different magnitudes depending on a separation distance from the magnet (a difference in magnitude of the magnetic force).

The magnet whose magnetic force is sensed by the hall sensor employs a magnet having two poles in a direction facing the hall sensor. If the magnet having two poles is used, the hall sensor may sense the magnetic force of both N and S poles, thereby extending a sensing range and also sensing even the directionality of the magnet, or the carrier having the magnet.

Meanwhile, in order to increase the space utilization, recently, an optical-reflector capable of reflecting light is provided at a front of the lens, and the optical-reflector is rotated based on a combined direction of two axes (X-axis and Y-axis) perpendicular to an optical axis (Z-axis) to correct a hand shaking.

As shown in FIG. 1, this device also includes a bipolar magnet 30 provided at a carrier 20 to which an optical-reflector is mounted, and a hall sensor 40 for sensing a magnetic force of the bipolar magnet 30 is applied. The hall sensor 40 shown in (a) of FIG. 1 is a hall sensor for detecting a rotation in the X-axis direction (rotation in a direction corresponding to the plane including the Y-axis and the X-axis).

If there is no rotation in the Y-axis direction (no rotation in a direction corresponding to the plane including the Z-axis and the Y-axis), as shown in (b) of FIG. 1, the hall sensor 40 outputs an electric signal corresponding to the movement size and direction of the carrier 20 in one-to-one relationship based on an initial position (default).

However, the conventional device generates three-dimensional movement since the carrier 20 rotates in a combined two-axis direction. For this reason, despite the fact that the value of the hall sensor output according to the magnitude and direction of the rotation based on the X-axis should maintain its sameness in one-to-one relationship, if the Y-axis rotation occurs, different values are output depending on the magnitude and direction of the Y-axis rotation (See (c) of FIG. 1).

In addition, since the hall sensor 40 of the conventional device complexly senses all of magnetic forces input into and output from each magnetic pole of the bipolar magnet, if a physical movement based on the Y-axis direction occurs, fluctuations or shifts occur greatly at the signal of the hall sensor that detects rotation in the X-axis direction.

In the convention device as described above, since the movement in the X-axis direction is directly affected by the movement in the Y-axis direction, the accurate position of the carrier 20 based on the X-axis direction may not be precisely generated.

Further, even though an algorithm for correcting the signal of the hall sensor 40 according to the movement or direction of the Y-axis direction is applied, since the magnitude, direction or the like of the movement based on the Y-axis change dynamically, it is very difficult to apply the correcting algorithm. Also, even though the correcting algorithm is applied, it is very difficult to implement the OIS which responds instantaneously to a hand shaking phenomenon because it takes a considerable amount of time to perform arithmetic processing.

SUMMARY

The present disclosure is designed to solve the problems of the related art, and therefore the present disclosure is directed to providing an apparatus for operating an optical-reflector and an apparatus for controlling a position of an optical-reflector, which may precisely generates a moving distance and a moving direction of a rotating carrier by simply calculating a signal value output from each hall sensor using at least one magnet having a single pole at a facing surface and a plurality of hall sensors provided at different positions to sense a magnetic force of the magnet, and thus precisely controls a position of the optical-reflector.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

In one aspect of the present disclosure, there is provided an apparatus for operating an optical-reflector, comprising: a first carrier configured to rotate based on a first direction perpendicular to an optical axis; a second carrier having an optical-reflector for reflecting a light toward a lens and accommodated in the first carrier to rotate based on a second direction perpendicular to both the optical axis and the first direction with respect to the first carrier; a plurality of magnets provided to the second carrier at different positions; a plurality of hall sensors configured to output signals respectively corresponding to the positions of the plurality of magnets; and a position control unit configured to calculate the signals input from the plurality of hall sensors to generate a position signal that is a signal about a current position of the second carrier.

Here, the magnet of the present disclosure may include a plurality of magnets provided to the second carrier at different positions, and in this case, the plurality of hall sensors may be configured to output signals respectively corresponding to the positions of the plurality of magnets.

In addition, the plurality of magnets of the present disclosure may include a first magnet provided to the second carrier; and a second magnet provided to the second carrier at a position having a moving displacement opposite to a moving displacement of the first magnet when the second carrier rotates, and in this case, the plurality of hall sensors may include a first hall sensor configured to output a first signal corresponding to the position of the first magnet; and a second hall sensor configured to output a second signal corresponding to the position of the second magnet.

Preferably, the magnet of the present disclosure may have a single pole at a surface that faces the plurality of hall sensors.

In an embodiment, the first and second magnets of the present disclosure may have the same pole at surfaces facing the first and second hall sensors, and the position control unit may generate the position signal by doing the subtraction to the first and second signals.

In another embodiment, the first and second magnets of the present disclosure may have different poles at surfaces facing the first and second hall sensors, and the position control unit may generate the position signal by doing the addition to the first and second signals.

More preferably, the first and second hall sensors of the present disclosure may be provided to the first and second magnets at positions having a relatively great rotating displacement, respectively.

In another aspect of the present disclosure, there is also provided an apparatus for controlling a position of an optical-reflector, which includes a first carrier configured to rotate based on a first direction perpendicular to an optical axis; a second carrier having an optical-reflector for reflecting a light toward a lens and accommodated in the first carrier to rotate based on a second direction perpendicular to both the optical axis and the first direction with respect to the first carrier; first and second magnets provided to the second carrier at different positions; and first and second hall sensors configured to output signals respectively corresponding to the positions of the first and second magnets, wherein the apparatus further comprises an input unit configured to receive signals from the first and second hall sensors; and a signal generating unit configured to calculate the signals input from the first and second hall sensors to generate a position signal that is a signal about a current position of the second carrier.

Preferably, the apparatus of the present disclosure may further comprise a driving control unit configured to control a power of magnitude and direction corresponding to the generated position signal to be applied to a driving coil that rotates the second carrier.

In addition, when the first and second magnets have the same pole at surfaces facing the first and second hall sensors, the signal generating unit of the present disclosure may generate the position signal by doing the subtraction to the first and second signals. Also, when the first and second magnets have different poles at surfaces facing the first and second hall sensors, the signal generating unit may generate the position signal by doing the addition to the first and second signals.

Moreover, the second magnet of the present disclosure may be provided to the second carrier at a position having a moving displacement opposite to a moving displacement of the first magnet when the second carrier rotates.

In another aspect of the present disclosure, there is also provided a method for controlling a position of an optical-reflector, comprising: a signal detecting step of detecting signals respectively corresponding to positions of a plurality of magnets provided to a carrier, which is provided to a front end of a lens and has an optical-reflector for reflecting a light toward the lens, at surfaces opposite to each other based on the carrier from a plurality of hall sensors; a position signal generating step of generating a position signal of the carrier by doing the subtraction to the signals when the plurality of magnets have the same pole at surfaces respectively facing the plurality of hall sensors and doing the addition to the signals when the plurality of magnets have different poles at surfaces respectively facing the plurality of hall sensors; and a position control step of controlling a position of the carrier by using the position signal.

According to a preferred embodiment of the present disclosure, since all of the plurality of hall sensors are configured to sense a magnetic force of a single pole magnet, even though an optical system (an optical-reflector) rotates in three dimensions, it is possible to effectively prevent the hall sensor signal from being disturbed or deviated.

In addition, according to another embodiment of the present disclosure, it is possible to extend or enhance the sensing area and resolution of the hall sensor just by allowing a plurality of hall sensors to respectively detect different moving displacements of magnets and performing a simple calculation of adding or subtracting the signals. Also, since the directionality of the optical-reflector may be accurately detected through a coding scheme of the calculation result values, the position of the optical-reflector may be corrected more precisely according to a hand shaking or the like.

Further, according to the present disclosure, since the position of the optical-reflector may be specified just with a simple physical configuration and algorithm and the position of the optical-reflector may be controlled based on the specified position, it is possible to further improve the responsiveness of the position correction function by a hand shaking.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
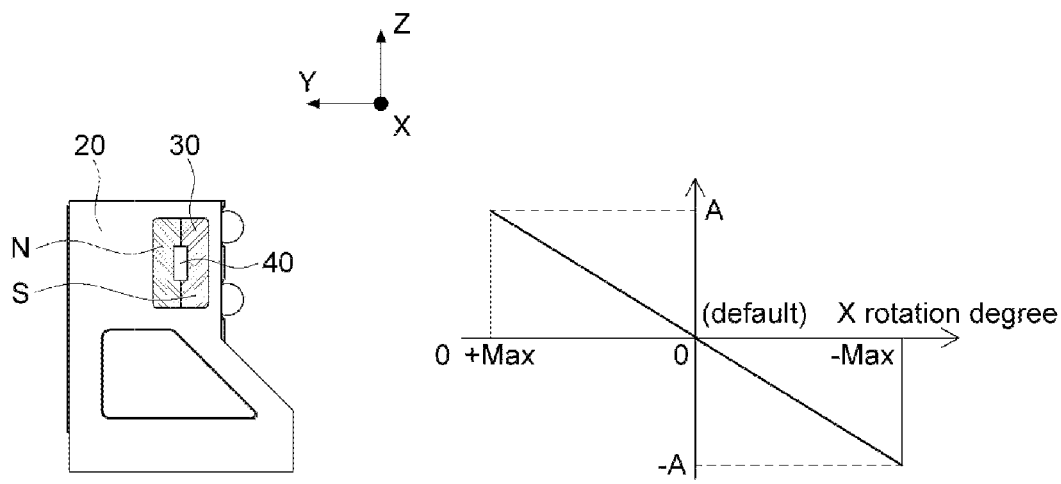
FIG. 1 is a diagram showing a structure of a conventional optical-reflector operating device an output signal of a hall sensor applied to the conventional optical-reflector operating device.
Figure 1:
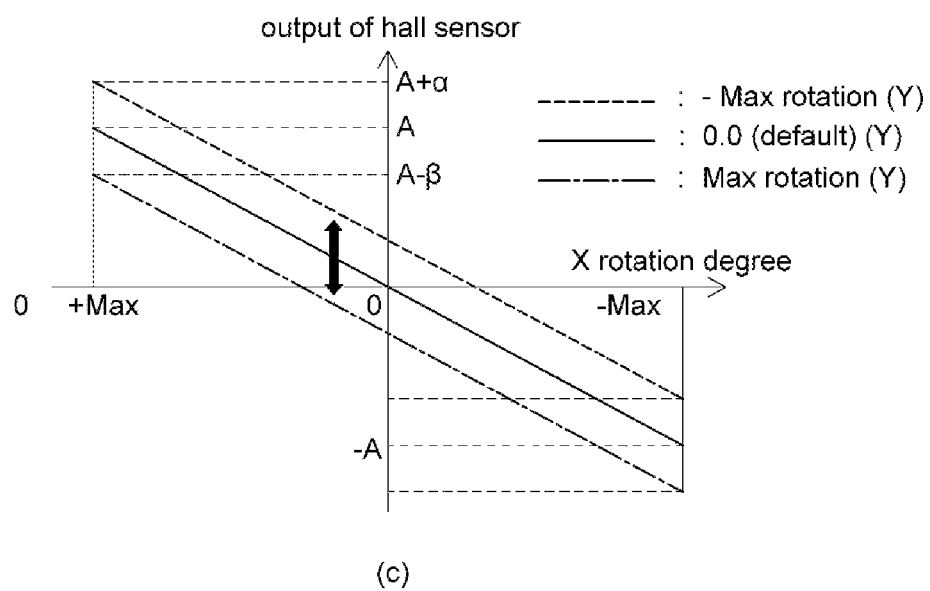
Figure 2:
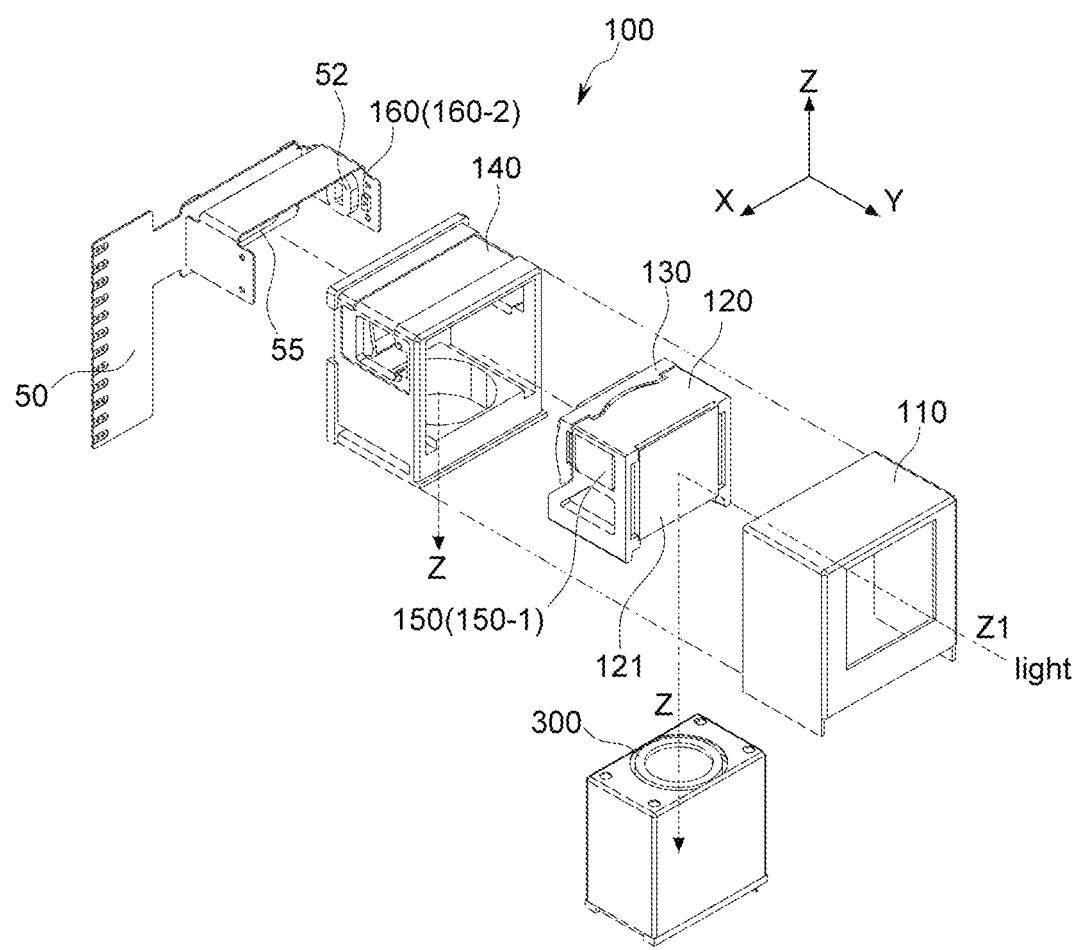
FIGS. 2 and 3 are diagrams showing a detailed configuration of an apparatus for operating an optical-reflector according to an embodiment of the present disclosure.
Figure 3:
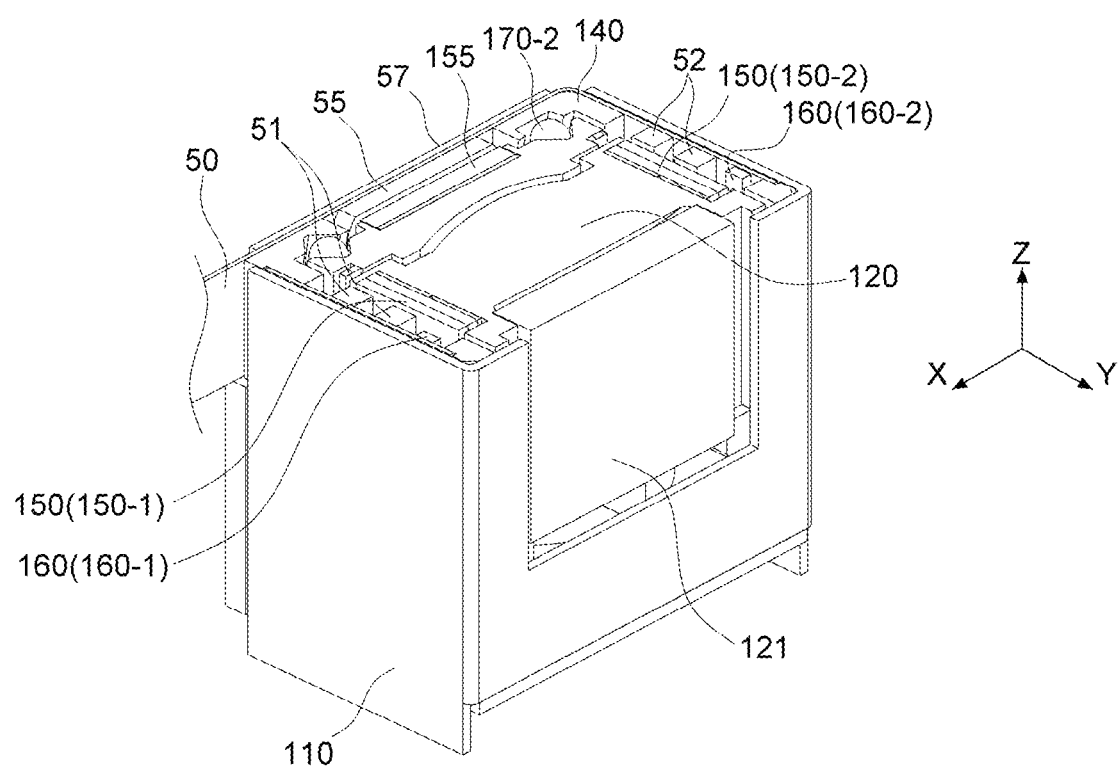
Figure 4:
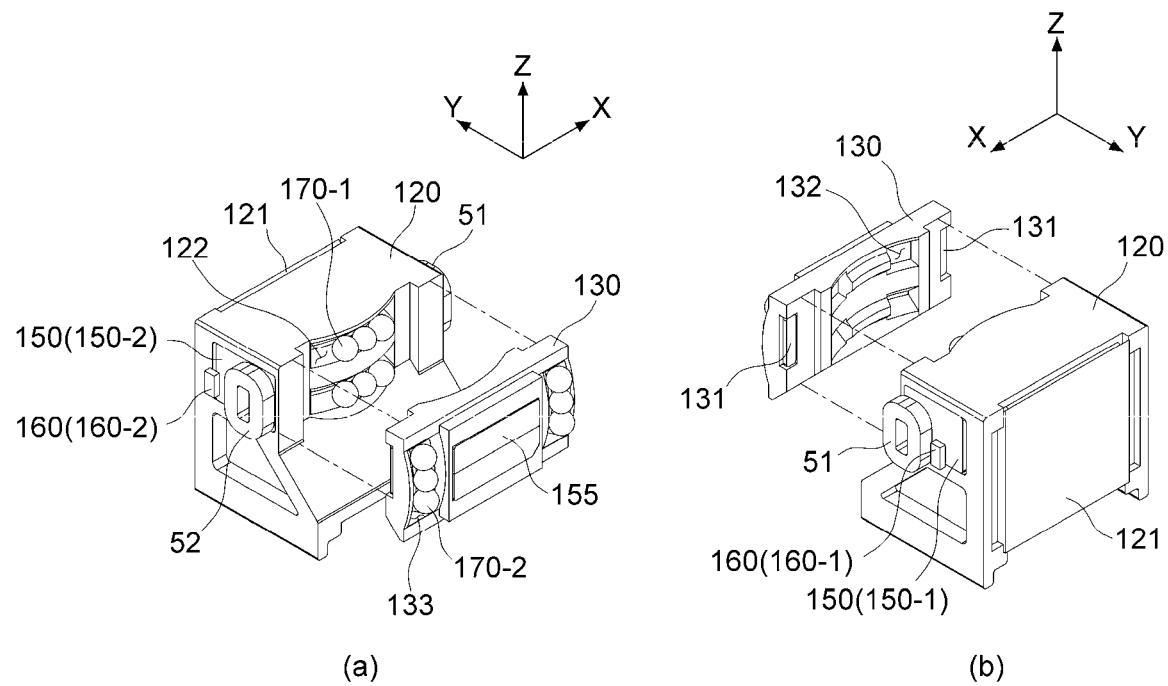
FIG. 4 is a diagram showing a structure of a first carrier and a second carrier of the present disclosure.

FIGS. 2 and 3 are diagrams showing a detailed configuration of an apparatus 100 for operating an optical-reflector (hereinafter, referred to as an 'operating apparatus') according to an embodiment of the present disclosure, and FIG. 4 is a diagram showing a structure of a first carrier 130 and a second carrier 120 of the present disclosure.

As shown in the figures, the operating apparatus 100 of the present disclosure may include a first carrier 130, a second carrier 120, a magnet 150, a chip 160 into which a hall sensor and a position control unit are integrated.

As described above, the hall sensor integrated into the chip 160 is an electronic device or unit that outputs an electric signal according to a distance from a magnet using a hall effect. An operating driver, which is commonly applied to a conventional device, uses the electric signal input from the hall sensor to perform a feedback control so that a power of magnitude and direction suitable for the driving coil is applied, and includes an I/O unit, a memory, a CPU, and the like.

The hall sensor and the operating driver may be mounted on a circuit board 50 as independent individual components, but the hall sensor and the operating driver may also be integrated as one chip.

The position control unit of the present disclosure, explained later, is a configuration meaning the operating driver. The figures depict an embodiment in which the position control unit is implemented as one chip or module together with at least one hall sensor among the plurality of hall sensors by means of SOC (System On Chip) or the like. In light of this, in the following description, the hall sensor and the position control unit will be referred to by the same reference sign.

The operating apparatus 100 of the present disclosure is disposed at a front end of a lens 300 shaped to extend in a vertical length (the Z-axis direction), and corresponds to a device for changing (reflecting, refracting or the like) a light path of a subject through an optical-reflector 121 to flow toward the lens 300.

As shown in FIG. 2, the operating apparatus 100 of the present disclosure may be configured to refract the light path by the optical-reflector 121 to allow the light to flow toward the lens 300. Thus, the lens 300 may be installed not in the thickness direction of a portable terminal but in a length direction of the portable terminal, and thus the thickness of the portable terminal is not increased to be optimized for a small and slim design of the portable terminal.

Based on the example shown in FIG. 2, the optical-reflector 121 of the present disclosure is installed at a side toward an opening of the case 110 into which light enters at the operating apparatus 100, namely at a side toward the front in the Y-axis direction.

In FIG. 2, the path of light coming from the outside is Z1, and the path of light introduced into the lens 300 formed by refracting or reflecting the light Z1 by the optical-reflector 121 is Z. In the following description, the Z-axis is referred to as an optical axis or an optical axis direction. One axis perpendicular to the optical axis is referred to as a Y-axis, and an axis perpendicular to both the optical axis and the Y-axis is referred to as an X-axis.

The optical-reflector 121 for changing the light path may be a mirror or a prism, or a combination thereof, and may be implemented using a variety of members that may reflect or change a path of light incident from the outside to the optical axis direction. The mirror or prism is preferably made of a glass material to improve the optical performance.

Also, although not shown in the figures, a photographing device such as a CCD or a CMOS that converts a light signal into an electric signal may be provided below the lens 300 based on the optical axis direction, and a filter for blocking or passing a light signal of a specific band may also be provided together.

As described below, in the present disclosure, the lens is not moved in two directions perpendicular to the optical axis Z, namely in the Y-axis direction (a first direction) and the X-axis direction (a second direction), but the optical-reflector 121 located at the front end of the lens 300 to change a light path is rotated in the Y-axis direction (the first direction) and the X-axis direction (the second direction) to implement OIS.

In the present disclosure, the Y-axis direction is referred to as the first direction and the X-axis direction is referred to as the second direction. However, these terms are merely distinguished relative to each other, and it is also possible that the X-axis direction is the first direction and the Y-axis direction is the second direction. That is, in the description of the present disclosure, the first direction may be one of the X-axis direction and the Y-axis direction, and the second direction may be a direction other than the first direction in the X-axis direction and the Y-axis direction.

The first carrier 130 of the present disclosure is accommodated in the housing 140 to rotate in the Y-axis direction (the first direction). If the first carrier 130 is a moving body that rotates, the housing 140 corresponds to a fixed body.

Meanwhile, the second carrier 120 of the present disclosure is accommodated in the first carrier 130 and configured to rotate in the X-axis direction (the second direction) based on the first carrier 130. In this regard, the first carrier 130 corresponds to a fixed body with respect to the second carrier 120 that rotates.

If the first carrier 130 rotates based on the Y-axis direction (a direction corresponding to the plane including the Y-axis and the Z-axis), since the second carrier 120 is accommodated in the first carrier 130, the second carrier 120 also rotates together with the first carrier 130.

In this state, if the OIS operation is performed in the X-axis direction (the direction corresponding to the plane including the X-axis and Y-axis), the second carrier 120 rotates in the X-axis direction with respect to the first carrier 130. That is, if the first carrier 130 rotates, the second carrier 120 rotates together, but, even though the second carrier 120 rotates, the first carrier 130 does not rotate due to the rotation of the second carrier 120.

Since the optical-reflector 121 of the present disclosure is provided to the second carrier 120, if the OIS operation is performed in the Y-axis direction by the above mechanism, the first carrier 130 and the second carrier 120 are rotated, and thus the optical-reflector 121 provided to the second carrier 120 also rotates based on the Y-axis direction to correct the hand shaking in the Y-axis direction.

Moreover, if the OIS operation is performed in the X-axis direction, only the second carrier 120 rotates based on the first carrier 130, and thus the optical-reflector 121 provided to the second carrier 120 rotates based on the X-axis direction to correct the hand shaking in the X-axis direction.

As shown in FIGS. 2 and 3, the circuit board 50 made of FPCB or the like is located on a rear surface of the housing 140 (based on the Y-axis direction). The circuit board 50 includes a third driving coil 55 for driving the first carrier 130, a first driving coil 51 and/or a second driving coil 52 for driving the second carrier 120, and the chip 160 into which the plurality of hall sensors for detecting the positions of the first carrier 130 and the second carrier 120 and the operation drive (position control unit) are integrated are mounted thereto.

If a power of proper magnitude and direction is applied to the third driving coil 55 provided to the circuit board 50, a magnetic force is generated between the third magnet 155 provided to the first carrier 130 and the third driving coil 55, and the first carrier 130 having the magnet 155 rotates by the generated magnetic force.

A plurality of second balls 170-2 are provided between the first carrier 130 and the housing 140. The first carrier 130 rotates based on the housing 140 with a frictional force minimized due to moving, rolling and point contact of the second balls 170-2, thereby allowing the first carrier 130 to rotate more smoothly, reducing noise, minimizing the driving force, improving the driving precision, and the like.

In order to maintain the separation between the housing 140 and the first carrier 130 as much as an appropriate distance and to guide the rotation of the first carrier 130 more effectively, as shown in FIG. 4, it is preferable that the second ball 170-2 is formed in at least one of the housing 140 and the first carrier 130 so as to be partially accommodated in a first guide rail 133 having a rounded shape.

In addition, a second yoke 57 of the present disclosure provided to the housing 140 is disposed to face the third magnet 155 provided at the first carrier 130 with the second ball 170-2 being interposed therebetween.

The second yoke 57 generates an attractive force to the third magnet 155 provided at the first carrier 130 so that the first carrier 130 having the third magnet 155 is not separated from the housing 140, and allows not only the point contact between the first carrier 130 and the second ball 170-2 but also the point contact between the housing 140 and the second ball 170-2 to be effectively maintained.

As shown in FIG. 3, the second carrier 120 of the present disclosure has a first magnet 150-1 and/or second magnet 150-2, and the housing 140 has a first driving coil 51 and/or second driving coil 52 provided to face the magnet(s), respectively.

As described above, the first hall sensor 160-1 and the second hall sensor 160-2 of the present disclosure output a signal corresponding to the magnetic force magnitude (corresponding to distance to position) of the first magnet 150-1 and the second magnet 150-2 to precisely detect a correct position of the optical-reflector 121 at present.

The first magnet 150-1 and/or the second magnet 150-2 for sensing the magnetic force of the hall sensors 160-1 and 160-2 maybe driving magnets that receive the magnetic force from the first driving coil 51 and/or the second driving coil 52, and in some embodiments, the first magnet 150-1 and/or the second magnet 150-2 may be sensing magnets that are additionally provided to the second carrier 120.

If the first hall sensor 160-1 and the second hall sensor 160-2 output signals corresponding to the position of the first magnet 150-1 and the second magnet 150-2, the position control unit integrated into the chip 160 of the present disclosure performs a feedback control so that a power of direction and magnitude corresponding to the signals magnitude power is applied to the first driving coil 51 and the second driving coil 52 to rotate the second carrier 120 in a reverse direction corresponding to the hand shaking, thereby correcting the hand shaking in the X-axis direction.

As shown in FIG. 4 and the like, the plurality of first balls 170-1 are provided between the first carrier 130 and the second carrier 120 to be partially accommodated in second guide rails 122, 132 having a rounded shape.

As shown in FIG. 4, the yoke 131 provided at the first carrier 130 and the like is disposed to face the first magnet 150-1 and/or the second magnet 150-2 provided at the second carrier 120 with the first ball 170-1 being interposed therebetween, and the yoke 131 generates an attractive force to the magnets 150-1, 150-2 so that the second carrier 120 is not separated from the first carrier 130, and also allows not only the point contact between the first carrier 130 and the first ball 170-1 but also the point contact between the second carrier 120 and the first ball 170-1 to be effectively maintained.

Figure 5:
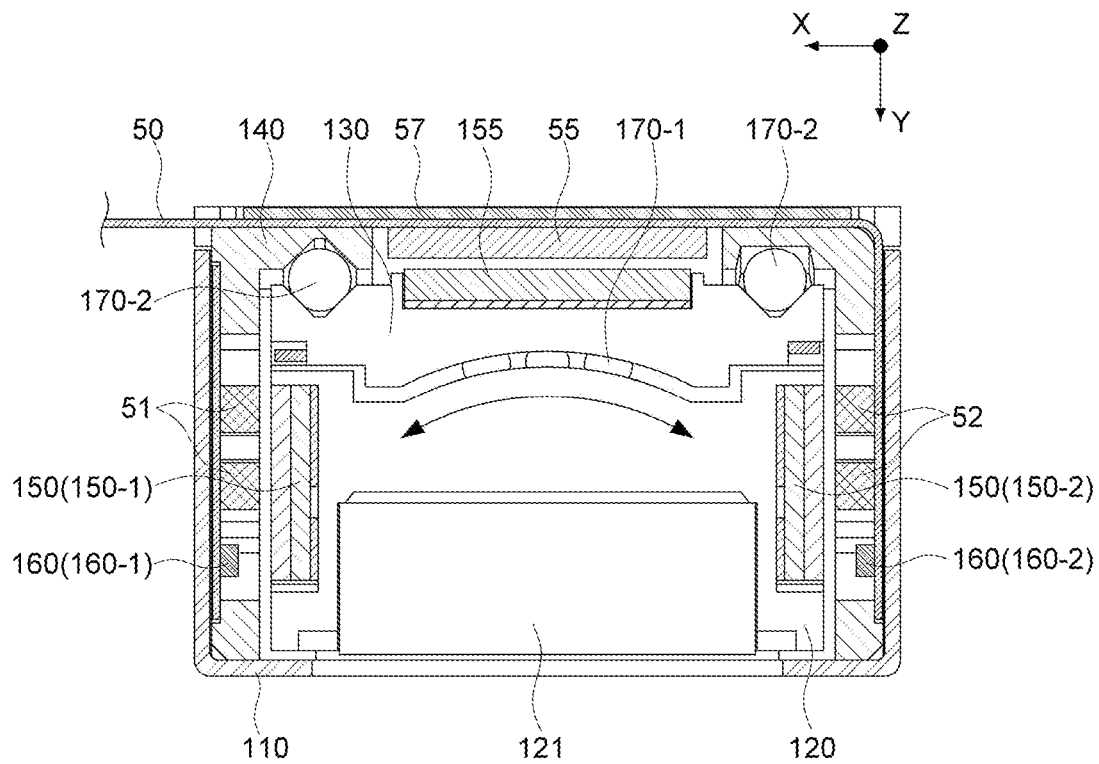
FIG. 5 is a cross-sectioned view showing a detailed configuration of the apparatus for operating an optical-reflector according to the present disclosure.

FIG. 5 is a cross-sectioned view showing a detailed configuration of the operating apparatus 100 according to the present disclosure. As shown in FIG. 5, the operating apparatus 100 of the present disclosure is configured so that the optical-reflector 121 rotates based on the Y-axis direction due to the rotation the first carrier 130 and also the optical-reflector 121 rotates based on the X-axis direction due to the rotation of the second carrier 120.

FIG. 5 corresponds to a diagram showing a detailed structure of the second carrier 120 that rotates based on the X-axis direction. If the position control unit integrated into the chip 160 controls a power of proper magnitude and direction for correcting hand shaking is applied to the first driving coil 51 and the second driving coil 52, the second carrier 120 rotates as indicated by a middle arrow in FIG. 5, thereby correcting the hand shaking or the like.

As shown in FIG. 5, the first magnet 150-1 of the present disclosure is provided at the second carrier 120, and the second magnet 150-2 may be provided at the second carrier 120, but at a position other than the position of the first magnet 150-1.

The first hall sensor 160-1 is provided at a position facing the first magnet 150-1 and outputs a first signal that is a signal corresponding to the position of the first magnet 150-1. The second hall sensor 160-2 is provided at a position facing the second magnet 150-2 and outputs a second signal that is a signal corresponding to the position of the second magnet 150-2.

If the first and second magnets 150-1, 150-2 are provided at different positions as described above, when the second carrier 120 moves, the first magnet 150-1 and the second magnet 150-2 move in different movement paths or different rotation angles, and thus the first and second hall sensors 160-1, 160-2 output different signals.

Although the first magnet 150-1 and the second magnet 150-2 may be a plurality of magnets physically distinguished, the magnet 150-1 and the second magnet 150-2 may also be a single magnet because the same result as above is obtained even when the hall sensors integrated into the chip 160 are located at different positions based on one single magnet.

As described in relation to the conventional art, if the hall sensor is configured to sense a magnetic force of a magnet that is magnetized in a bipolar form, the hall sensor senses all the directions of magnetic force entering and exiting from the N pole and the S pole, and thus the magnetic force of the magnet 150 provided at the second carrier 120 changes in three dimensions due to the rotation of the first carrier 130, thereby generating signal disturbance more greatly.

For this reason, in the present disclosure, in order to effectively solve the above problem, a magnet having a single pole, instead of two poles, at a surface facing the hall sensor is used. If the single pole magnet is provided to face the hall sensor, the hall sensor senses only a magnetic force magnitude value of a specific polarity generated from the single pole, and thus the signal disturbance caused by the three-dimensional position change is significantly reduced.

If each of the plurality of hall sensors 160-1, 160-2 outputs a signal corresponding to the position of the magnet 150 corresponding thereto, the position control unit of the present disclosure calculates the signals to generate a position signal that is a signal about a current position of the second carrier 120.

If the hall sensor integrated into the chip 160 is configured to sense the magnetic force of the single pole magnet, the sensing area may be narrowed in comparison with the case of sensing the magnetic force of a bipolar magnet.

However, if a simple calculation is performed to enhance or emphasize the signal characteristics of all hall sensors integrated into the chip 160 as in the present disclosure, it is possible to expand the sensing area and increase the sensed signal magnitude, thereby overcoming the disadvantage that the sensing area is narrowed.

In this regard, it is preferable that the second magnet 150-2 is provided to the second carrier 120, 5 at a position having a moving displacement opposite to the moving displacement of the first magnet 150-1, as shown in the example of FIG. 5.

In this case, since the hall sensors 160-1, 160-2 output time-series signals having characteristics contradictory to each other, when these signals are calculated, the sensed magnitude and the like may be further enhanced as described later.

As shown in FIG. 5, if the second carrier 120 rotates in a clockwise direction, since both the first magnet 150-1 and the second magnet 150-2 are mounted to the second carrier 120, the second carrier 120 rotates in the clockwise direction along with the rotation of the second carrier 120.

If the first carrier 130 rotates in the clockwise direction, the first magnet 150-1 moves in a direction closer to the first hall sensor 160-1, and the second magnet 150-2 moves in a direction away from the second hall sensor 160-2, opposite to the first magnet 150-1.

That is, if the first carrier 130 rotates in one direction, any one of the first hall sensor 160-1 and the second hall sensor 160-2 has a characteristic of increasing the signal value and the other has a characteristic of decreasing the signal value.

Further, if the first and second magnets 150-1, 150-2 and the first and second hall sensors 160-1, 160-2 are positioned in mutually symmetrical relationship, the hall sensor signals may be increased or decreased directly proportional to each other.

The present disclosure uses the above mutual relationship to calculate the signals of the hall sensors and use the calculated results in the drive control of the optical-reflector 121. By doing so, it is possible to generate a hall sensor signal of magnitude sufficient for each X-axis direction position of the optical-reflector 121 and to accurately sense the directionality thereof.

Figure 6:
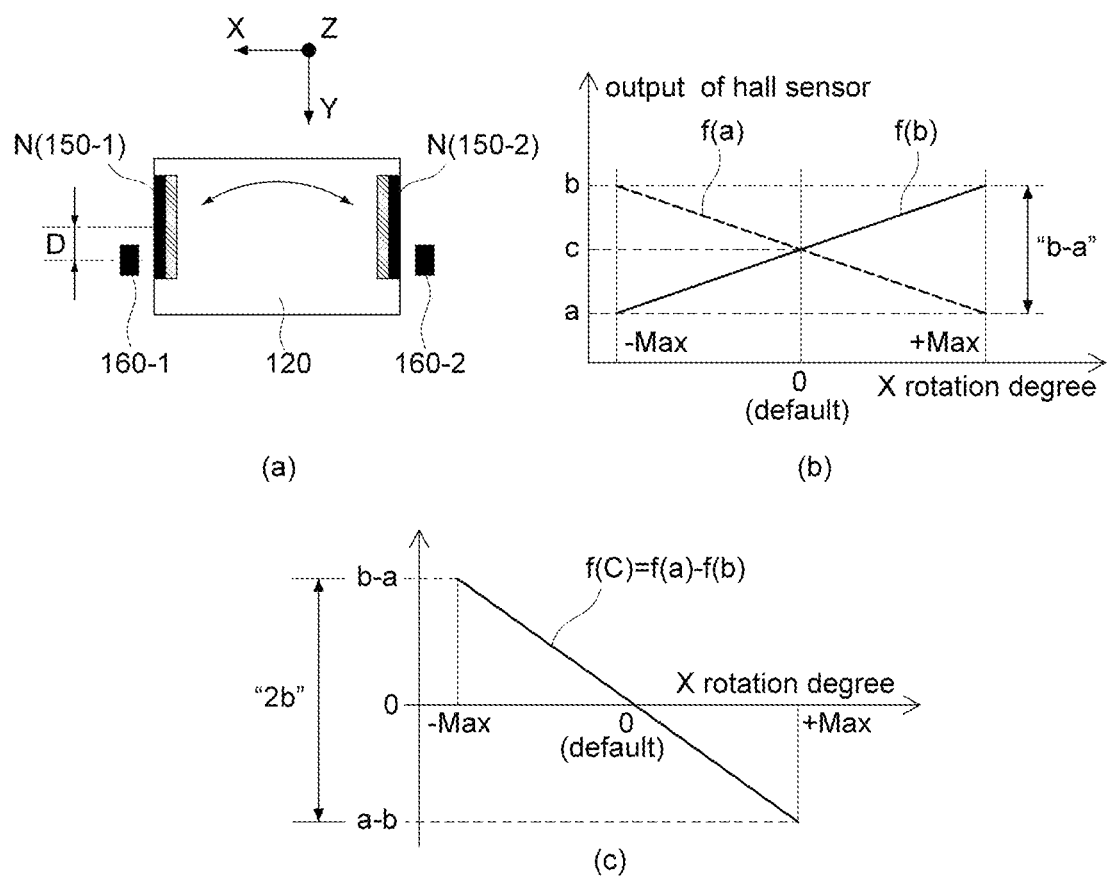
FIGS. 6 and 7 are diagrams showing output signals of the plurality of hall sensors and embodiment of the present disclosure for calculating the output signals.
Figure 7:
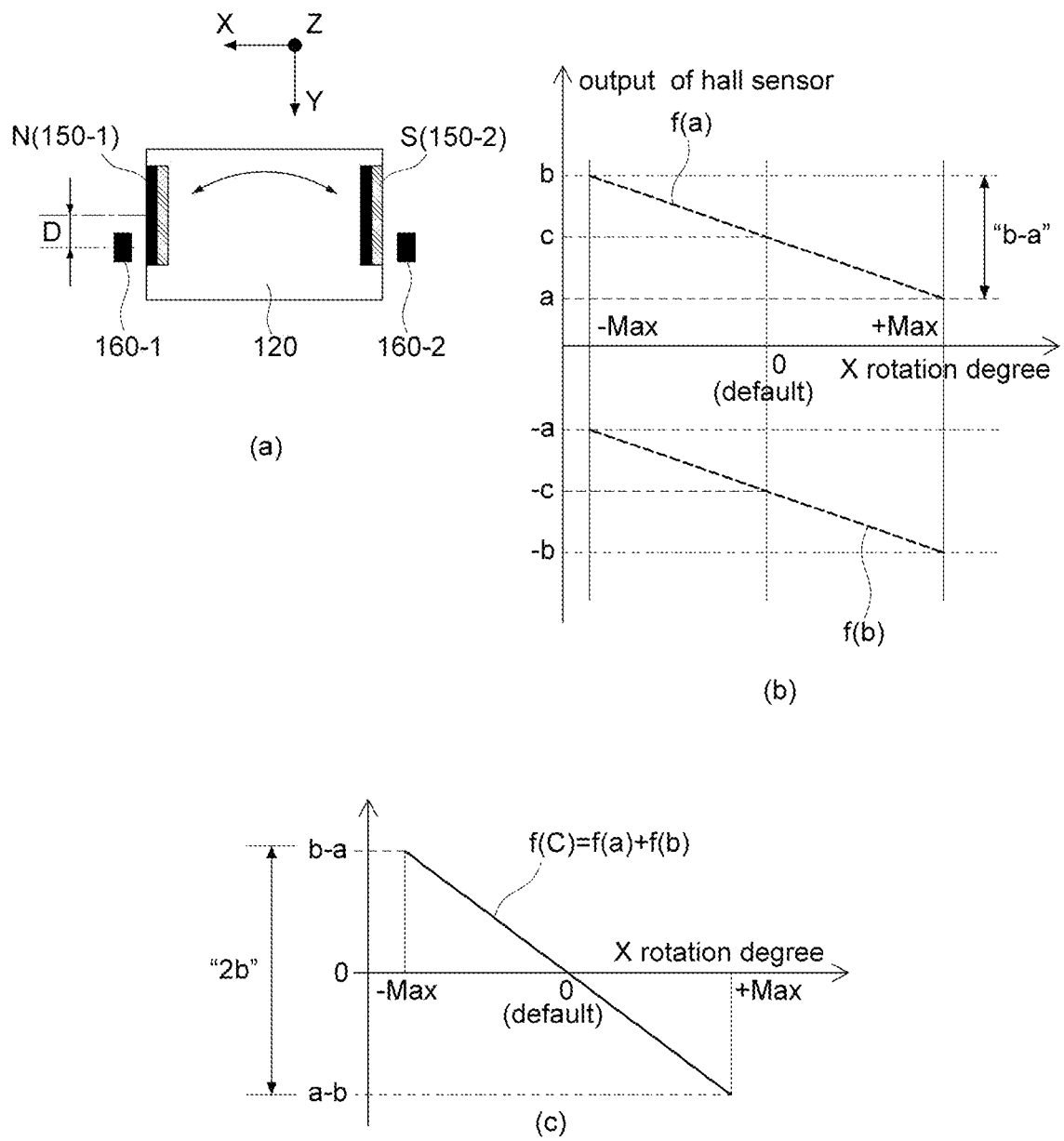

FIGS. 6 and 7 are diagrams showing an output signal of the plurality of hall sensors and embodiment of the present disclosure for calculating the output signals. FIG. 6 shows the case where the pole of the first magnet 150-1 facing the first hall sensor 160-1 is identical to the pole (N) of the second magnet 150-2 facing the second hall sensor 160-2.

If the second carrier 120 rotates in a clockwise direction or in a counterclockwise direction based on a reference position (default) of the second carrier 120, a first signal f(a) that is an output value of the first hall sensor 160-1 and a second signal f(b) that is an output value of the second hall sensor 160-2 come into the form of (b) of FIG. 6. Since the output signal of the hall sensor has a linear relationship with the distance between the magnet and the hall sensor, the first signal and the second signal are inversely proportional to each other.

Thus, if the subtraction is performed to the first signal f(a) and the second signal f(b), the sensed magnitude is reinforced from "b-a" to "2b" as shown in (c) of FIG. 6, so that the rotation of the second carrier 120 may be sensed more clearly.

In addition, if the subtraction is used to the first signal f(a) and the second signal f(b), position signals of a signal system including both positive and negative number regions may be generated as in (c) of FIG. 6, which also allows the rotation direction of the second carrier 120 to be accurately sensed.

As the rotating displacement of the first magnet 150-1 and the second magnet 150-2 is larger, the signal output by the hall sensors 160-1, 160-2 changes more greatly. Thus, in order to further improve the resolution of the signals sensed by the hall sensors 160-1, 160-2, the first magnet 150-1 and the second magnet 150-2 are preferably provided to the second carrier 120 at positions deviated from the center of the second carrier 120.

In addition, in order to further improve the resolution of the signal detected by the hall sensor, as shown in (a) of FIG. 6 and (a) of FIG. 7, the first hall sensor 160-1 and the second hall sensor 160-2 are more preferably provided at positions displaced (D) from the center of the first magnet 150-1 and the second magnet 150-2.

FIG. 7 shows the case where the pole of the first magnet 150-1 facing the first hall sensor 160-1 is opposite to the pole of the second magnet 150-2 facing the second hall sensor 160-2.

In this case, as shown in (b) of FIG. 7, the first signal f(a) has a positive value and the second signal f(b) has a negative value. Thus, if the addition is applied to first signal f(a) the second signal f(b), the sensed magnitude may be expanded from "b-a" to "2b", and a position signal of a signal system including both positive and negative number regions may be generated, as shown in (c) of FIG. 7.

Figure 8:
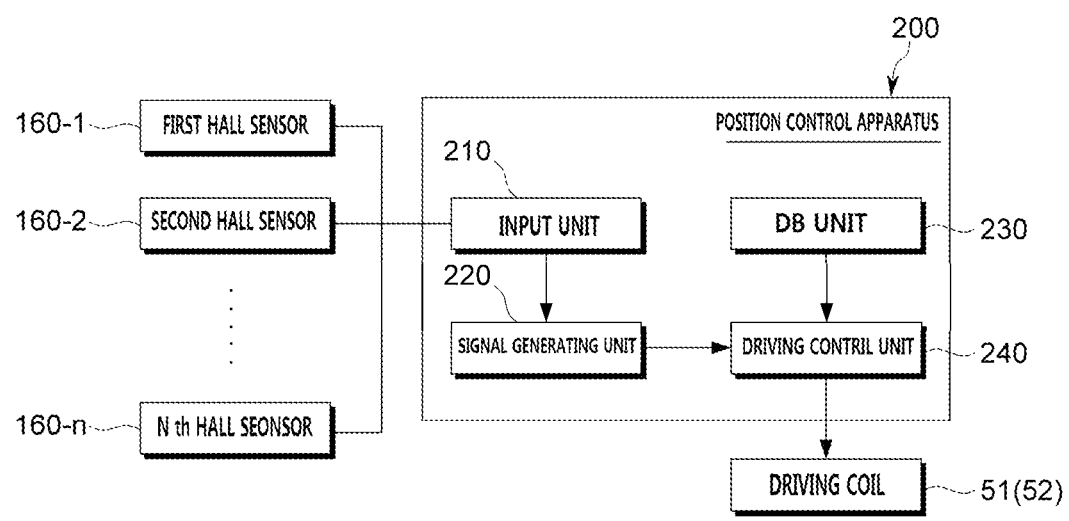
FIG. 8 is a block diagram showing a detailed configuration of an apparatus for controlling a position of an optical-reflector according to another embodiment of the present disclosure.
Figure 9:
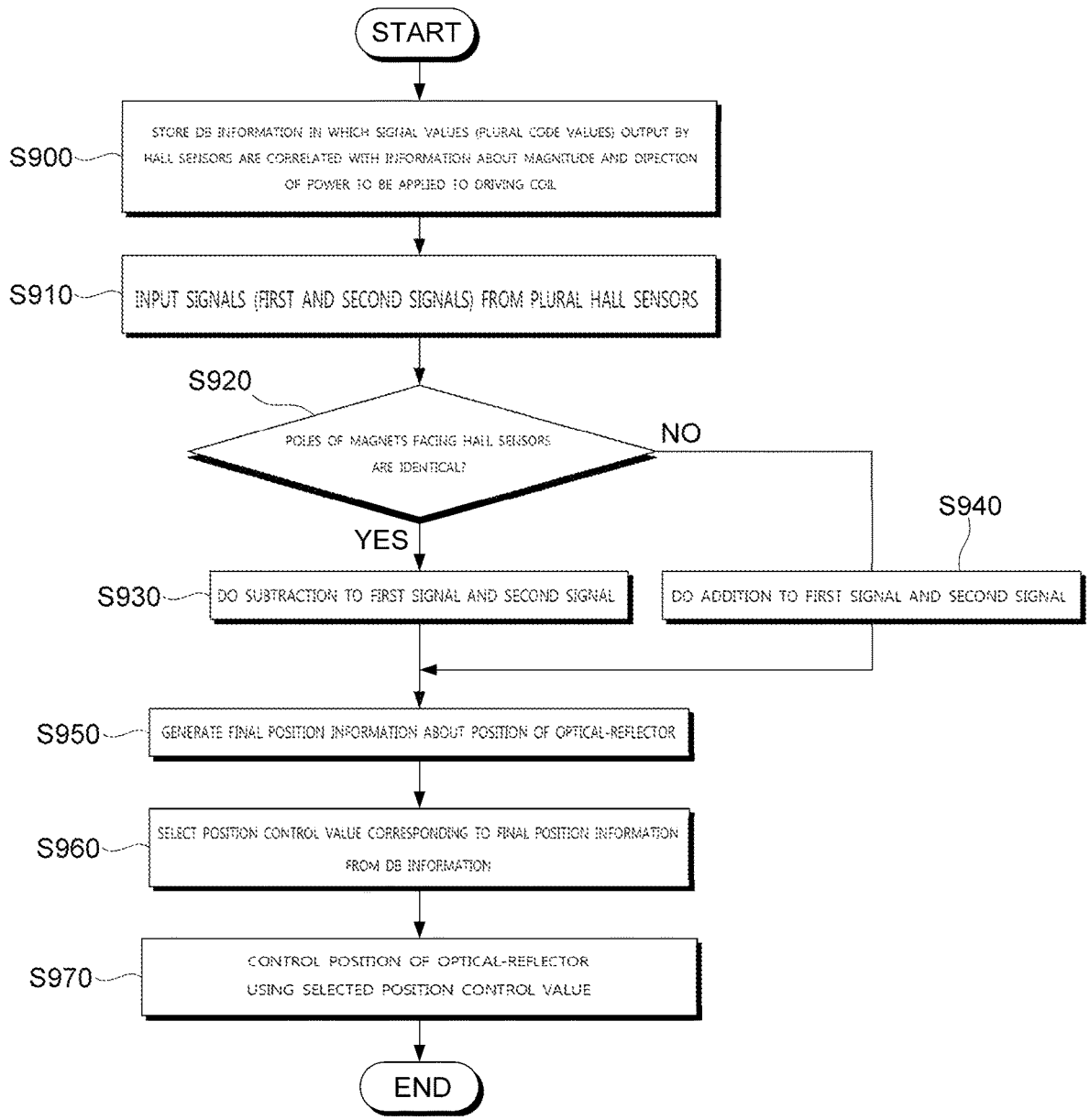
FIG. 9 is a flowchart for illustrating processes of a method for controlling a position of an optical-reflector according to the present disclosure.

FIG. 8 is a block diagram showing a detailed configuration of a position controlling apparatus 200 according to another embodiment of the present disclosure, and FIG. 9 is a flowchart for illustrating processes of a method for controlling a position of an optical-reflector, performed at the position controlling apparatus 200 according to the present disclosure.

If the embodiment of the present disclosure described above is an embodiment in relation to a camera actuator that drives the rotation of the optical-reflector 121, the position controlling apparatus 200 of the present disclosure described below is a device or module mounted to a camera actuator, which corresponds to an operating driver described above.

The position controlling apparatus 200 of the present disclosure as shown in FIG. 8 corresponds to the position control unit integrated into the chip 160 of the operating apparatus 100 according to the present disclosure as described above. In addition, even though FIG. 8 depicts that the position controlling apparatus 200 of the present disclosure is independent from the hall sensor integrated into the chip 160, if the position controlling apparatus 200 and the hall sensor integrated into the chip 160 are implemented as one chip or module as described above, the position controlling apparatus 200 of the present disclosure may include the hall sensor integrated into the chip 160.

Prior to explaining the present disclosure in detail, it should be understood that components of the position controlling apparatus 200 according to the present disclosure as depicted in FIG. 8 are not physically distinguished but logically distinguished.

In other words, each component corresponds to a logic component for implementing a technical feature of the present disclosure, and thus even though any components are integrated or divided, it should be interpreted as falling within the scope of the present disclosure as long as the function of the logic component of the present disclosure is accomplished. Also, any components having identical or similar functions should be interpreted as falling within the scope of the present disclosure regardless whether their terms are identical or not.

As shown in FIG. 8, the position controlling apparatus 200 of the present disclosure may include an input unit 210, a signal generating unit 220, a DB unit 230, and a driving control unit 240.

As described above, the input unit 210 corresponds to an interface for receiving a signal from the first hall sensor 160-1 and the second hall sensor 160-2 (S910).

As shown in the figures, in an embodiment, the input unit 210 of the present disclosure may be configured to receive signals from a plurality of hall sensors 160-n, for example three or more hall sensors, (S910), and in this case, the position control unit integrated into the chip 160 of the present disclosure may be configured to generate a position signal by using all of the plurality of signals or a combination of selected signals.

If the first signal and the second signal are input from the input unit 210 (S910), the signal generating unit 220 of the present disclosure calculates the first signal and the second signal to generate a position signal that is a signal about a current position of the second carrier 120 (S950).

The DB unit 230 of the present disclosure may store DB information such as a lookup table in which control value information in relation to the magnitude and direction of power transmitted to the driving coils 51, 52 is correlated with an electric signal value (a code value) output from the hall sensor based on specification information of the hall sensor and the driving coils 51, 52 (S900).

If the position signal is generated in the signal generating unit 220, the driving control unit 240 of the present disclosure accesses and reads information stored in the DB unit 230 and selects control value information corresponding to the position signal (S960).

If the control value information is selected as above, the driving control unit 240 of the present disclosure controls the power of magnitude and direction corresponding to the control value information to be applied to the corresponding driving coils 51, 52, thereby performing the OIS operation by the optical-reflector 121 (S970).

As described above, in the present disclosure, if the first magnet 150-1 and the second magnet 150-2 have the same pole at surfaces facing the first hall sensor 160-1 and the second hall sensor 160-2, the signal generating unit 220 generates the position signal by doing the subtraction to the first signal and the second signal (S930).

In addition, in an embodiment, if the first magnet 150-1 and the second magnet 150-2 have different poles at surfaces facing the first hall sensor 160-1 and the second hall sensor 160-2, the signal generating unit 220 of the present disclosure generates the position signal by doing the addition to the first signal and the second signal (S940).

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In the above description of this specification, the terms such as "first", "second", "upper" and "lower" are merely conceptual terms used to relatively identify components from each other, and thus they should not be interpreted as terms used to denote a particular order, priority or the like.

The drawings for illustrating the present disclosure and its embodiments may be shown in somewhat exaggerated form in order to emphasize or highlight the technical contents of the present disclosure, but it should be understood that various modifications may be made by those skilled in the art in consideration of the above description and the illustrations of the drawings without departing from the scope of the present invention.

What is claimed is:

1. An apparatus for operating an optical-reflector, the apparatus comprising:
    a housing;
    a first carrier accommodated in the housing and configured to rotate, based on a first direction perpendicular to an optical axis, with respect to the housing;
    a lens;
    a second carrier having an optical-reflector for reflecting a light toward the lens and accommodated in the first carrier to rotate based on a second direction perpendicular to both the optical axis and the first direction with respect to the first carrier;
    a plurality of magnets provided to the second carrier at different positions, the plurality of magnets having the same pole or different poles at surfaces facing a plurality of hall sensors;
    the plurality of hall sensors configured to output signals respectively corresponding to the positions of the plurality of magnets; and a position control unit configured to calculate the signals input from the plurality of hall sensors to generate a position signal that is a signal about a current position of the second carrier, wherein the position control unit is configured to generate the position signal by doing a subtraction to the signals if the plurality of magnets having the same pole at the surfaces facing the plurality of hall sensors; and the position control unit is configured to generate the position signal by doing an addition to the signals if the plurality of magnets have different poles at the surfaces facing the plurality of hall sensors.

2. The apparatus for operating an optical-reflector according to claim 1, wherein the plurality of magnets includes:

a first magnet provided to the second carrier; and a second magnet provided to the second carrier at a position having a moving displacement opposite to a moving displacement of the first magnet when the second carrier rotates; and wherein the plurality of hall sensors includes:

a first hall sensor configured to output a first signal corresponding to the position of the first magnet; and a second hall sensor configured to output a second signal corresponding to the position of the second magnet.

3. The apparatus for operating an optical-reflector according to claim 1, wherein each of the plurality of magnets has a single pole at the surface that faces the plurality of hall sensors.

4. The apparatus for operating an optical-reflector according to claim 2, wherein the first and second magnets have the same pole at surfaces facing the first and second hall sensors; and the position control unit generates the position signal by doing the subtraction to the first and second signals.

5. The apparatus for operating an optical-reflector according to claim 2, wherein the first and second magnets have different poles at surfaces facing the first and second hall sensors; and the position control unit generates the position signal by doing the addition to the first and second signals.

6. The apparatus for operating an optical-reflector according to claim 2, wherein the first and second hall sensors are provided to the first and second magnets at positions having a relatively great rotating displacement, respectively.

7. An apparatus for controlling a position of an optical-reflector, comprising:

a housing;

a first carrier accommodated in the housing and configured to rotate based on a first direction perpendicular to an optical axis with respect to the housing;

a lens;

a second carrier having an optical-reflector for reflecting a light toward the lens and accommodated in the first carrier to rotate based on a second direction perpendicular to both the optical axis and the first direction with respect to the first carrier;

first and second magnets provided to the second carrier at different positions, the first and second magnets having the same pole or different poles at surfaces facing the first and second hall sensors;

a first hall sensor configured to output a first signal corresponding to the position of the first magnet;

a second hall sensor configured to output a second signal corresponding to the position of the second magnet;

an input unit configured to receive the first signal from the first hall sensor and the second signal from the second hall sensor; and a signal generating unit configured to calculate the first signal and second signal input from the first and second hall sensors to generate a position signal that is a signal about a current position of the second carrier and, wherein, when the first and second magnets have the same pole at the surfaces facing the first and second hall sensors, the signal generating unit generates the position signal by doing a subtraction to the first and second signals; and when the first and second magnets have different poles at the surfaces facing the first and second hall sensors, the signal generating unit generates the position signal by doing an addition to the first and second signals.

8. The apparatus for controlling a position of an optical-reflector according to claim 7, further comprising:

a driving control unit configured to control a power of magnitude and direction corresponding to the generated position signal to be applied to a driving coil that rotates the second carrier.

9. The apparatus for controlling a position of an optical-reflector according to claim 7, wherein when the first and second magnets have the same pole at the surfaces facing the first and second hall sensors, the signal generating unit generates the position signal by doing the subtraction to the first and second signals.

10. The apparatus for controlling a position of an optical-reflector according to claim 7, wherein, when the first and second magnets have different poles at the surfaces facing the first and second hall sensors, the signal generating unit generates the position signal by doing the addition to the first and second signals.

11. The apparatus for controlling a position of an optical-reflector according to claim 7, wherein the second magnet is provided to the second carrier at a position having a moving displacement opposite to a moving displacement of the first magnet when the second carrier rotates.

* * * * *